United States Patent [19]

Drummond et al.

[11] Patent Number: 5,132,248
[45] Date of Patent: Jul. 21, 1992

[54] DIRECT WRITE WITH MICROELECTRONIC CIRCUIT FABRICATION

[75] Inventors: Timothy Drummond, Ann Arbor, Mich.; David Ginley, Albuquerque, N. Mex.

[73] Assignee: The United States of America as represented by the United States Department of Energy, Washington, D.C.

[21] Appl. No.: 200,096

[22] Filed: May 31, 1988

[51] Int. Cl.$^5$ .............. H01L 21/00; H01L 21/02; H01L 21/68; C23C 26/00
[52] U.S. Cl. .................... 437/173; 437/174; 437/935; 427/53.1; 427/96
[58] Field of Search ........... 437/173, 174, 935; 427/53.1, 96; 148/DIG. 50

[56] References Cited

U.S. PATENT DOCUMENTS

| | | | |
|---|---|---|---|
| 4,088,799 | 5/1978 | Kurtin | 427/38 |
| 4,297,782 | 11/1981 | Ito | 29/571 |
| 4,299,860 | 11/1981 | Schaefer et al. | 427/53.1 |
| 4,349,408 | 9/1982 | Tarng et al. | 156/628 |
| 4,493,143 | 1/1985 | Maier | 29/590 |
| 4,495,255 | 1/1985 | Draper et al. | 428/669 |
| 4,511,600 | 4/1985 | Leas | 427/75 |
| 4,526,807 | 7/1985 | Auerbach | 427/53.1 |
| 4,560,580 | 12/1985 | Needham et al. | 427/53.1 |
| 4,568,411 | 2/1986 | Martin | 156/655 |

FOREIGN PATENT DOCUMENTS 0222496 5/1987 European Pat. Off.
3047884 7/1982 Fed. Rep. of Germany

OTHER PUBLICATIONS

J. Reeds et al., "High Speed Precision X-Y Stage", *Journal of Vacuum Science Technology B*, vol. 3, No. 1, Jan./Feb. 1985, pp. 112–116.
G. Higashi et al., "Patterned Aluminum Growth Via Excimer Laser Activated Metalorganic Chemical Vapor Deposition", *Applied Physics Letter*, vol. 48, No. 16, Apr. 21, 1986, pp. 1051–1053.
G. Fisanick et al., "Relation of Local Transformation Dynamics To Final Reaction Profiles In Laser-Initiated Decompositions of Thin Films", extended abstract of a 1985 Materials Research Society Pres.
R. von Gutfeld et al., "Recent Advances In Laser-Enhanced Plating" *Materials Research Society Symp.*, Proc., vol. 29, 1984, pp. 325–332.
R. von Gutfeld et al., "Laser-Enhanced Plating and Etching: Mechanisms and Applications", *IBM J Research Development*, vol. 26, No. 2 Mar. 1982, pp. 136–144.
M. Gross et al., "Laser-Initiated Deposition Reactions: Microchemistry In Organogold Polymer Films", *Applied Physics Letter*, vol. 47 No. 9, Nov. 1, 1985, pp. 923–925.
T. Baum et al., "Laser Chemical Vapor Deposition of Gold", *Applied Physics Letter*, vol. 47, No. 5, Sep. 1, 1985, pp. 538–540.

*Primary Examiner*—Brian E. Hearn
*Assistant Examiner*—B. Everhart
*Attorney, Agent, or Firm*—Karla Ojanen; James H. Chafin; William R. Moser

[57] ABSTRACT

In a process for deposition of material onto a substrate, for example, the deposition of metals or dielectrics onto a semiconductor laser, the material is deposited by providing a colloidal suspension of the material and directly writing the suspension onto the substrate surface by ink jet printing techniques. This procedure minimizes the handling requirements of the substrate during the deposition process and also minimizes the exchange of energy between the material to be deposited and the substrate at the interface. The deposited material is then resolved into a desired pattern, preferably by subjecting the deposit to a laser annealing step. The laser annealing step provides high resolution of the resultant pattern while minimizing the overall thermal load of the substrate and permitting precise control of interface chemistry and interdiffusion between the substrate and the deposit.

17 Claims, 3 Drawing Sheets

Ag THINKJET ON PAPER

Ag THINKJET ON PAPER

Ag THINKJET ON PAPER

DIRECT WRITE WITH MICROELECTRONIC CIRCUIT FABRICATION

The U.S. Government has rights in this invention pursuant to Contract No. DE-AC04-76DP00789 between the U.S. Department of Energy and AT&T Technologies, Inc.

BACKGROUND OF THE INVENTION

This invention generally relates to the deposition of material onto a substrate, especially in the field of microelectronic circuit production. The invention especially relates to the deposition of metals or dielectric substances onto the surface of semiconductors. In addition, this invention relates to the resolution of patterns formed by deposition of a material onto a substrate.

In the art of microelectronic circuitry, it is often necessary for layers and/or patterns to be formed on the surface of a semiconductor substrate by deposition, oxidation or epitaxial growth. For example, such processes are involved in providing semiconductors with ohmic contacts, Schottky barriers and dielectric barriers, all of which are required in the production of complicated integrated circuits. For the deposition of metals, metal alloys, or dielectric substances, the conventional processes require numerous steps, including: etching; photoresist deposition, irradiation and development; metallization; and annealing. In the production of complicated circuits, each of these steps must be repeated several times with each successively deposited layer being applied so as to register with previous layers with sub-micron accuracy.

Under current procedures for the deposition of a metal or a dielectric substance, photolithographic processes are usually employed such as disclosed in U.S. Pat. Nos. 4,349,408 (Tarng et al) and 4,568,411 (Martin). Initially, the substrate wafer is cleaned and etched if necessary. A photoresist is then spun onto the wafer and exposed to irradiation through a carefully aligned mask. The type of photoresist used is chosen on the basis of the desired primary processing step which is to follow, e.g., etching or metallization.

In order to achieve good resolution and edge definition of the photoresist relief structure, it is quite often required that the mask be pressed firmly against the photoresist during irradiation. For this reason, it is important that the front and back surfaces of the wafer be flat and parallel. Otherwise, edge definition of the resultant relief structure will be poor. Furthermore, if the front and back surfaces of the wafer are not flat and parallel, substrate damage such as breakage may occur.

After the mask is brought into position, the photoresist is exposed through the mask by visible, ultraviolet, e-beam, or X-ray radiation. The choice of radiation is dependent upon the type of photoresist and the resolution and nature of the patterns required for the resultant relief structure. Normally, the shorter the wavelength of exposure radiation, the better the resolution of the desired pattern. The unexposed resist (negative resist) or exposed resist (positive resist) is removed by solvent and the surface of the substrate is cleaned. Frequently, the remaining resist, which forms the relief structure on the substrate, requires the further step of thermal annealing for good adhesion.

After exposure and development of the photoresist, the wafer is subjected to the primary processing step such as etching, deposition of a metal or dielectric, or both.

Following the primary processing step, the initial photoresist relief structure is removed and the next photoresist layer is spun onto the wafer to form a new relief structure for use in the next metallization or etching step. The successive photoresist layers must be applied in register to sub-micron degree and the chemistry of the photoresist layers as well as their topography must be suitable for the intended primary processing step whether it be etching, metallization, or some other processing step.

During the cycling of the substrate wafer through the successive steps of photoresist deposition, photoresist exposure and development, followed by etching and/or material deposition, the risk of modifying the surface chemistry of the substrate wafer in some fashion, which in almost all circumstances is an undesirable result, remains very high. Furthermore, often times complete removal of the photoresist layer requires etching the semiconductor surface, resulting in an unwanted removal of material from the surface.

Another disadvantage of the prior art multistep photolithographic process is that for the production of a microelectronic circuit requiring several metallizations and/or etching steps, the excessive amount of handling of the substrate involved leads to an increased risk of damage to the substrate, e.g., breakage, bending or contamination.

Another disadvantage associated with the prior art processes is that during material deposition steps, such as chemical vapor deposition of dielectrics or evaporation or sputtering techniques used in metallization, the entire wafer is often subjected to high temperatures which may also detrimentally affect the surface chemistry of the semiconductor.

Furthermore, the conventional deposition techniques are limited in regard to the types of materials which can be successfully deposited on a substrate wafer. In evaporation processes, a metal charge is evaporated and then deposited on a cold substrate and photoresist by physical vapor deposition. This procedure is suitable for atomically pure metals. However, when the metal charge is an alloy, it is not always possible to control evaporation so that the components of the alloy will concurrently evaporate. This renders it difficult to achieve the desired stoichiometry within the deposited alloy layer.

In the metallization technique known as sputtering a target material is bombarded by ions whereby surface atoms of the target material become volatile and are deposited by physical vapor deposition onto the substrate and photoresist. However, here again not all deposit materials are suitable for the sputtering technique. Moreover, this procedure tends to degrade the definition of the photoresist relief structure and also may damage the surface of the wafer itself.

The processes of evaporation and sputtering are not well suited for the deposition of refraction materials such as tungsten or dielectrics, e.g., $SiO_2$. For these materials, chemical rather than physical vapor deposition is commonly used which requires precise control of reaction conditions.

Another process for metal deposition is disclosed in U.S. Pat. No. 4,511,600 (Leas), wherein a metal pattern is deposited on a substrate by forcing a molten metal through a vibrated array of orifices.

In recent years, lasers have been used in conjunction with conventional primary processing steps such as deposition, plating and etching. For example, the use of lasers in chemical vapor deposition steps are disclosed by Baum et al, "Laser Chemical Vapor Deposition," *Appl. Phys. Lett.* 47 (6), Sept., 1985, p. 538–40 and Higashi et al, "Patterned Aluminum Growth via Exterior Laser Activated Metalorganic Chemical Vapor Deposition," *Appl. Phys. Lett.* 48 (16), April 1986, pp. 151–53. Laser-enhanced plating processes are disclosed by Gutfeld et al, "Laser-Enhanced Plating and Etching Mechanisms and Applications," *IBM J. Res. Develop.*, Vol. 24:No.2, March 1982, pp. 136–44 and Gutfeld et al, "Recent Advances in Laser-Enhanced Plating", Mol. Res. Soc. *Symp. Proc.*, Vol. 29, 1984, pp. 325–32.

Lasers have also been used in the decomposition of thin films coated on substrates. See Fisanick et al, "Relation of Local Transformation Dynamics to Final Reaction Profiles in Laser-Initiated Decompositions of Thin Films", pp. 157–59; Gross et al, "Laser-Initiated Deposition Reactions: Microchemistry in Organogold Polymer Films", *Appl. Phys. Lett.* 47(9) November, 1985, p. 923 and U.S. Pat. No. 4,526,807 (Auerbach).

In addition, lasers have been used for injecting particles into substrates (U.S. Pat. No. 4,299,860, Schaefer et al); in printing of print compounds encapsulated in polyarylene sulfide substrates (U.S. Pat. No. 4,560,580, Needham et al); and in surface alloying (U.S. Pat. No. 4,495,255, Draper et al).

SUMMARY OF THE INVENTION

An object of this invention is to provide a process for depositing material onto a substrate, such as in the production of microelectronic circuitry, which minimizes handling of the substrate and also minimizes the potential for surface modification of the substrate material during the deposition.

Another object of this invention is to provide a deposition process suitable for depositing a wide range of materials.

A further object of the invention is to provide a process for the formation of a high resolution pattern on the surface of a semiconductor substrate without requiring the use of photoresist layers.

Upon further study of the specification and appended claims, further objects and advantages of this invention will become apparent to those skilled in the art.

These objects have been achieved by providing a process of forming a pattern on a substrate by deposition of a material, comprising:

(a) depositing a suspension of colloidal particles of the material to be deposited in a solvent on to a substrate by ink jet printing, (b) resolving the deposited material by laser annealing.

In the process according to the invention, materials are deposited on a substrate by an ink jet printing technique. The materials to be deposited are formulated as colloidal suspensions and then, using ink jet printing techniques, the suspensions are directly written on-to the substrate surface. The ink jet printing technique, e.g., a piezoelectric driven jet system, can either be a continuous or pulsed delivery, e.g., drop on demand. Following the printing step, the deposited material is thermally, preferably laser annealed. Excess material can be easily removed from the substrate surface by washing.

The process according to the invention permits materials to be deposited onto a surface by a physical procedure which requires much less handling than the known lithographic processes. In the previous processes, before metal or dielectric substance could be applied to the substrate, a photoresist is deposited, exposed to irradiation, and then developed by solvent treatment. Frequently, the windows of the photoresist relief structure must be again cleaned before the metal or dielectric is deposited. The substrate with resist is then transferred to a high vacuum chamber wherein deposition takes place.

By the process according to the invention, the metal or dielectric is written directly onto the surface of the substrate. The process according to the invention further permits multiple level processing in register, an ability not found within the prior art. Thus, the several process steps involved with photoresists and photolithography which require excessive handling are essentially eliminated.

Another advantage is that the ink jet printing process is suitable for depositing a wide variety of substances, and thus is not limited to any specific materials as are the processes of evaporation, sputtering and chemical vapor deposition. Any material which can be mechanically ground or chemically formed as a colloid can be deposited by the process according to the invention. It does not matter whether the material to be deposited is conducting or insulating, hard or soft, refractory or low melting, nor does it matter if the material is an element, an alloy or a compound.

The colloidal suspension can be either a true suspension or a suspension of colloidal particles induced by subjecting a mixture to vibration or stirring. The suspension can further contain dispersing agents such as emulsifiers and surfactants. These agents generally are employed in amounts ranging from about 1 to 2 wt%, although amounts outside this range can also be used.

The size of the colloidal particles can vary within a wide range. The choice of particle size is dependent upon the available orifice size for the nozzles used in ink jet printing and on the width and height of the desired pattern features. Generally, the particle size of the colloids is within the range of about 100 Å to 40 um. For best resolution of the resultant pattern, the colloid particles are within the range of about 100–1,000 Å.

As indicated, the process of the invention is suitable for depositing any material which can be formed as a colloid either mechanically or chemically. Thus, the process of the invention is suitable for depositing pure metals, such as Au, Cu, Pt, and Ag, as well as refractory metals, such as W, Ta, Mo or SiC. Furthermore, the inventive process has an advantage over prior art metallization techniques in that it can be used to easily deposit complex alloys, such as $Ni_2GaAs$ or $AuGa_2$. Dielectrics such as $Si_3N_4$ and $SiO_2$, which are commonly deposited by complicated chemical vapor deposition techniques, can also be deposited by the simpler ink jet printing process of the invention. Also, the process of the invention can be used to deposit superconductive materials such as yttrium barium copper oxide ($YBa_2CuO_7$) and the Tl-Ca-Ba-Cu-O and Bi-Ca-Sr-Cu-O materials.

In formulating the colloidal suspension, the solvent or liquid medium employed is chosen on the basis of the material to be deposited and also the ease of evaporation. The chosen solvent should be one which does not deleteriously interact with the substrate or the material to be deposited. Also, volatile solvents are preferred since these solvents can easily be evaporated without requiring the application of excessive temperatures which may result in an undesired modification of substrate surface chemistry. Organic solvents are preferred. Examples of suitable solvents are water, acetone, lower alcohols such as butanol, methanol and ethanol, low boiling hydrocarbons such as hexane, benzene and toluene, and halogenated hydrocarbons such as methylene chloride.

The concentration of colloids can vary within a wide range. Preferably, the colloid content of the suspension is about 1-20 wt%. The ink jet printing system is also capable of handling a wide range of viscosity. For example, the viscosity of the suspension can be comparable to that exhibited by lower alcohols up to those exhibited by so-called waxy substances.

Although volatile solvents are preferred, a low boiling point solvent is not required since the preferred laser annealing step will result in the evaporation of even higher boiling solvents such as, for example, ethylene glycols. In any event, if heat is to be applied to the substrate in a drying stage, the ambient temperature around the substrate is preferably kept below about 150° C. to avoid damage to the overall substrate. Heat can be applied during a drying stage by any suitable means such as a drying lamp.

After the material is deposited, the deposit is then annealed. Annealing can be performed thermally, such as within a thermal oven, but it is preferred that annealing be performed using a laser. Annealing deposited material by a laser is highly advantageous. Laser annealing provides localized heating, is easy to control and also results in high resolution of the resultant pattern.

During laser annealing, the deposited material is homogenized and the desired pattern resolved. When the deposited material is a metal, laser annealing also serves to activate the deposited metal.

Laser annealing is advantageous over other annealing procedures in that it permits the minimization of interdiffusion between the deposit and the substrate while still maintaining good adhesion. With laser annealing, an abrupt interface is formed between the deposit and the substrate with a micro-interdiffusion of only a few angstroms. This provides good adhesion between the deposit and substrate while still maintaining the important electrical properties. Although laser annealing can lead to localized melting of the substrate, this localized melting can be easily controlled by the rate and density of laser irradiation.

The laser power used during annealing is determined by several factors such as the desired line width of the resultant pattern. Furthermore, the laser power should be low enough so that thermal shock of the substrate and excessive volatization of the colloidal material are prevented. In addition, inter-diffusion of the deposited material into the substrate should not be so high as to deleteriously effect the functionality of the resultant microcircuit.

The specifications of the laser are not limited to any specific type, and thus many varieties of lasers can be employed in the annealing step. The laser beam can either be continuous wave or pulsed. The wavelength can either be short or long, although higher resolutions are attainable with short wavelengths as in, for example, the visible or ultra-violet ranges.

The process of the invention can be used for depositing materials on a wide variety of substrates and is especially suitable to the deposition of materials onto semiconductor substrates. The process of the invention is particularly useful for depositing materials onto ceramic substrates, e.g., those used in IC packaging where the deposition of normal metal and semiconducting interconnects is involved.

In addition, substrate materials which are defect prone or low melting, as well as substrates which are difficult to handle, such as InSb and $HgI_2$, can be used in the deposition process of the invention.

Since the ink jet printing technique results in a minimization of handling with very little energy being applied to the substrate at the interface during deposition, the risk of mechanical damage to the substrate and the possibility of modifying substrate surface chemistry are substantially reduced. Furthermore, the highly controllable laser annealing step keeps the overall thermal load of the substrate to a minimum while also providing precise control over surface interface chemistry and interdiffusion between the deposit and the substrate.

By means of the ink jet printing technique, especially in combination with the laser annealing step, a high resolution can be obtained for the resultant pattern. Thus, according to the process of the invention, structures on the order of about 10-50, especially 20-50 microns in size can be easily obtained. In addition, the process can also achieve smaller features within a size range of about 1-10 microns. Even sub-micron structures are possible. Furthermore, the process can also be modified to provide structures larger than 50 microns, e.g., on the order of 100 to 400 microns, which may be particularly suitable for large contacts and interconnects. Even extremely large structures such as on the order of 1 millimeter can be achieved. The width of the resultant lines in the pattern can be varied in several ways, such as by varying particle size of the colloidal suspension, orifice size of the ink jet printing nozzle, as well as by control of the laser annealing step, e.g., laser focussing and energy level.

A coarse resolution of the resultant pattern can be obtained by using the steps of jet ink printing deposition followed by thermal annealing. When a coarse resolution is desired, a subsequent cleaning step to remove excess material is often unnecessary. On the other hand, a fine resolution can be achieved when deposition is followed by laser annealing. In this process version, a subsequent cleaning step is preferably performed so as to remove the excess unannealed material. Removal of excess material can be performed by washing the substrate with a solvent, preferably the same solvent used to prepare the colloidal suspension.

The process of the invention can easily be reduced to a system which takes advantage of the minimal handling requirements while also providing for the production of complicated integrated circuits. The substrates can be loaded into a holder contained in an ambient or inert atmosphere. An inert atmosphere is preferred since oxidation of the substrate and deposit materials is avoided. Above the holder are positioned an ink jet printing head for delivery of the colloidal suspension, a laser for use in the annealing step and, optionally, means for drying the substrate such as, for example, drying lamps.

In such a system, deposition and resolution can be performed with very little handling of the substrate. Furthermore, successive metal or dielectric depositions can be performed within the same system by providing multiple orifices in the print head for the delivery of the different colloidal suspensions.

The process of the invention can also be easily integrated into a system using etching by further providing means for conventional etching procedures, e.g., a delivery system for applying etchants to the substrate surface. Etching can be performed before or after deposition of the colloidal suspension. A jet etch step can be used to control the etching procedure or alternatively a photochemically active etchant can be applied and etching controlled by subjecting the etchant to laser exposure. In this manner, the direct write process of the invention permits integration of pre-etching, post-etching, materials deposition, annealing for both resolution and device activation and subsequent washing. Such an integrated process is especially useful for the production of multiple levels in register. For example, the integrated process can comprise: (a) loading a substrate wafer into a substrate holder; (b) pre-etching said substrate by application of an etchant; (c) depositing a suspension of colloidal particles of the material to be deposited in the solvent onto said substrate by ink jet printing; (d) laser annealing the deposited material on said substrate; (e) washing said substrate to remove residual excess material; (f) and applying additional levels of materials by repeating steps (b)-(e).

Preferably, the substrate is held on an X-Y-Z positionable table to easily control the position of the substrate relative to the ink jet and etchant delivery systems. Formation of the deposited pattern onto the substrate can be implemented by either moving the substrate relative to the print head or vice versa. Preferably, both the print head and the substrate are movable.

BRIEF DESCRIPTION OF THE DRAWINGS

Various other objects, features and attendant advantages of the present invention will be more fully appreciated as the same becomes better understood when considered in conjunction with the accompanying drawings, wherein:

In FIG. 1 the overall schematic of a system according to the invention is illustrated. The substrate is introduced through a load lock wherein etchant delivery capabilities are provided for cleaning the substrate. The substrate is then transferred to a fabrication chamber and positioned onto an X-Y-Z substrate table. In the fabrication chamber means are provided for etchant delivery, ink delivery, laser application and also drying means, such as an IR drying lamp. Within the fabrication chamber, the colloidal suspension is deposited onto the substrate by a jet ink print head, optionally dried by the IR drying lamp and then laser annealed to resolve the desired pattern on the substrate. Etchant delivery is provided to clean the substrate by removing excess deposited material after laser annealing. The substrate is removed from the fabrication chamber by means of the exit lock. As shown in FIG. 1, computer control can be used to control the laser, X-Y-Z substrate table, drying lamp and ink and etchant delivery systems.

In FIG. 2 there is illustrated an isolated view of the X-Y-Z substrate table with the substrate positioned thereon. Also shown are the print head and etchant delivery systems, laser optic means and drying lamp. The print head is under translational control and, thus, is movable with respect to the substrate on the substrate table. The print head is provided with multiple orifices for the delivery of several different colloidal suspensions, as well as a solvent jet and/or etchant jet.

FIGS. 3A-3C are three microphotographs of Ag colloid printed onto ordinary paper using a dot matrix printer, i.e., a modified Hewlett Packard Thinkjet print head. The solvent used for the colloidal suspension was methanol.

Figure 1:
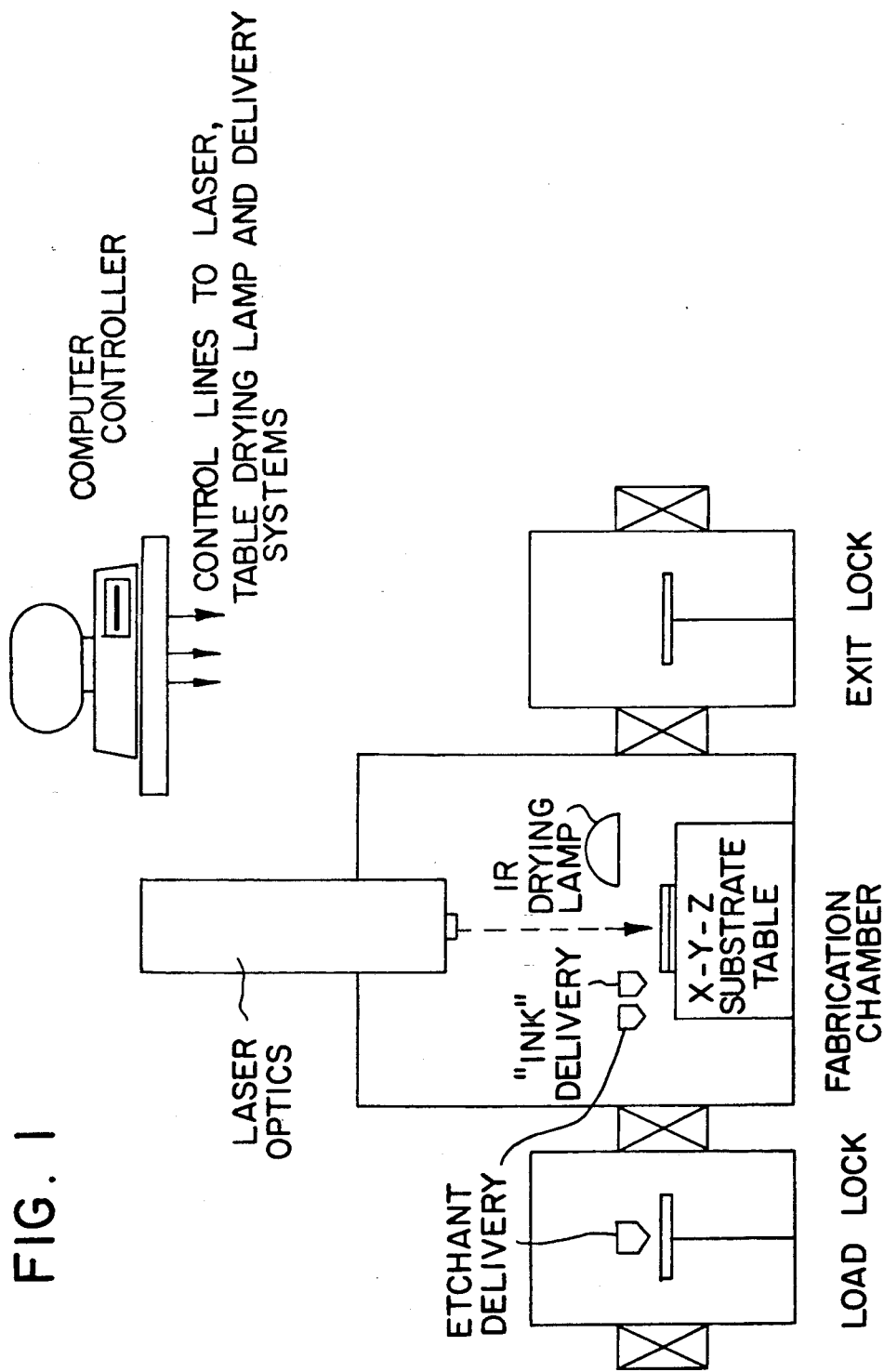
FIG. 1 is an overall schematic of a prototype for the direct write systems.
Figure 2:
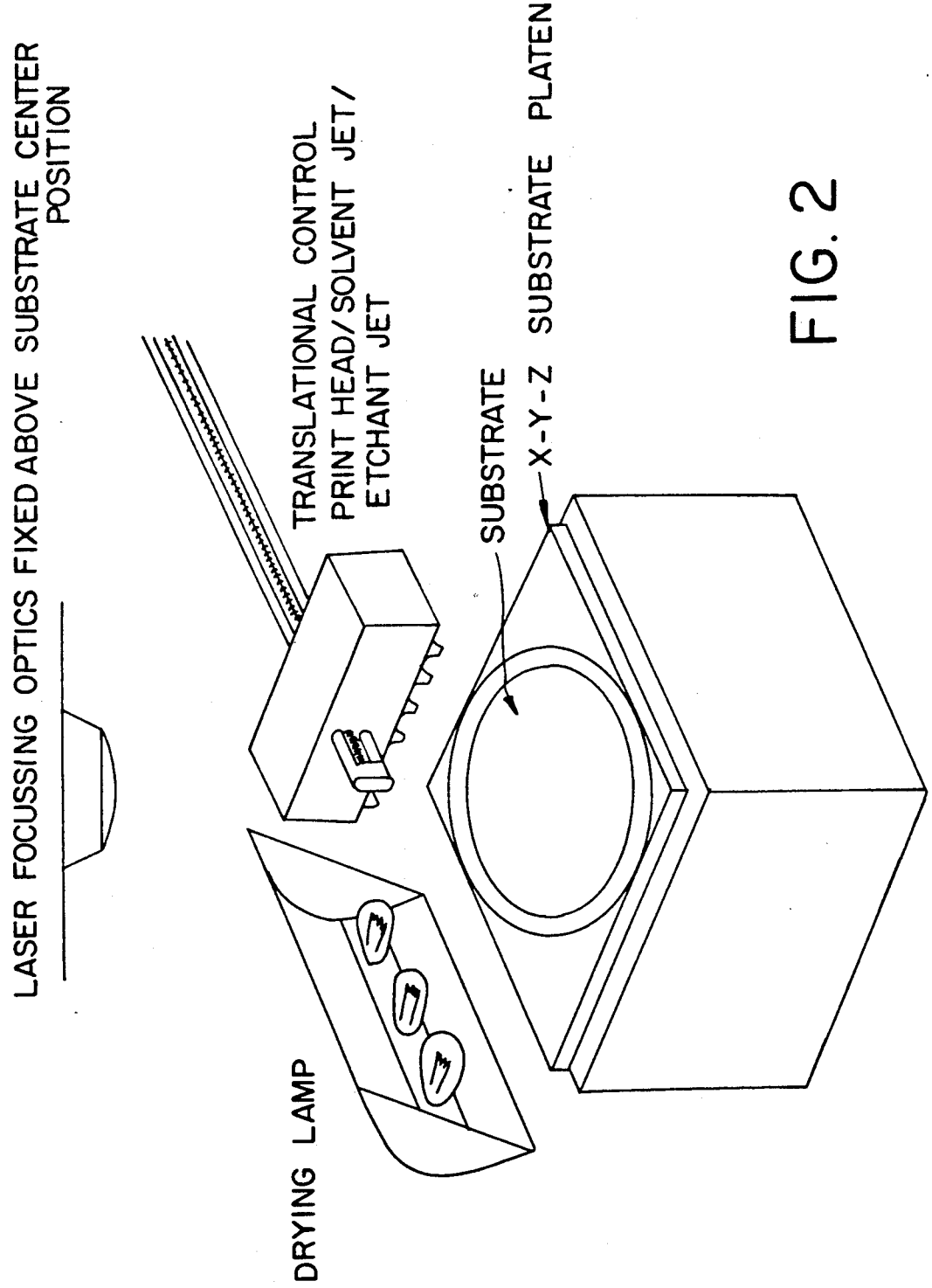
FIG. 2 is an enlargement of the central area of the direct write system.
Figure 3A:
FIGS. 3A, 3B and 3C are photomicrographs of patterns deposited using a dot matrix ink jet printer.
Figure 3B:
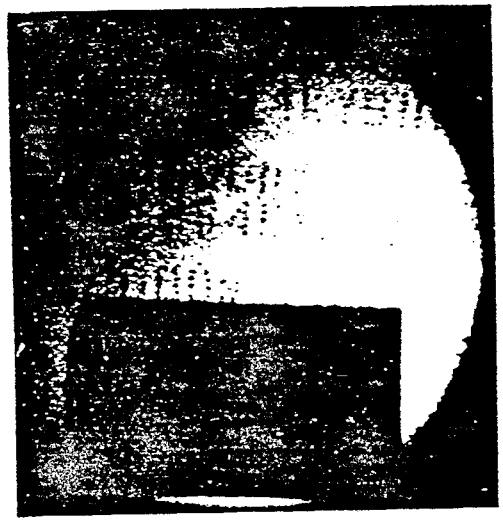
Figure 3C:
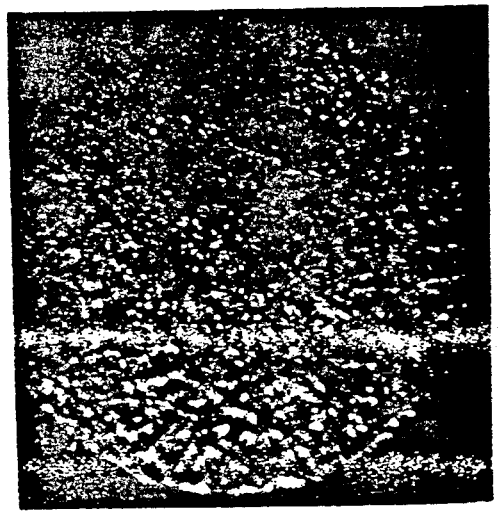

From the foregoing description, one skilled in the art can easily ascertain the essential characteristics of this invention, and without departing from the spirit and scope thereof, can make various changes and modifications of the invention to adapt it to various usages and conditions.

The entire text of all applications, patents and publications, if any, cited above and below are hereby incorporated by reference.

EXAMPLE

Printing of colloidal Au metal on GaAs with the direct write jet system

Au metal lines were printed on GaAs wafers using the direct write ink jet system. The Au colloidal solution was prepared from gold particles supplied by G.E. The gold particles were generated by sputtering off of an Au target into Santovac vacuum pump oil and had an average particle size less than 100 A. The solution was prepared by adding 0.94 g of Au particles to 3.0 ml of methylene chloride and allowing the particles to autodisperse for 30 min. The solution was then sonicated to break up any aggregates. The solution was loaded into the ink reservoir of the direct write system and continually stirred with a magnetic stir bar.

EXAMPLE 1

A 47.8 micron orifice printhead and 50 micron Gelmann filter were installed and the fluid valve on the system bypassed. Lines were printed on GaAs substrates using frequencies of 1500 to 900 Hertz and preamplified voltages of 0.2 to 0.8 V. Distinct lines resulted from printing in 1 pass with printed linewidths of 130 to 380 microns. Multiple passes resulted in thicker, more diffuse lines. Vacuum annealing of the samples at 500 C for 30 min. resulted in electrically conductive Au lines on GaAs. Similar results have been obtained with Au, Cu, Ag and $YBa_2Ca_3O_{6.9}$ inks on $Al_2O_3$ substrates as well as silica substrates.

The preceding example can be repeated with similar success by substituting the generically or specifically described reactants and/or operating conditions of this invention for those used in the preceding examples.

From the foregoing description, one skilled in the art can easily ascertain the essential characteristics of this invention, and without departing from the spirit and scope thereof, can make various changes and modifications of the invention to adapt it to various usages and conditions.

What is claimed is:

1. A process for forming a pattern on a substrate by deposition of a material, consisting of:
   (a) depositing a suspension of colloidal particles of the material in a solvent on to a substrate by ink jet printing;
   (b) evaporating the solvent, the material remaining on the substrate;

(C) laser annealing the deposited material to the substrate, the pattern being defined by the path of the laser beam; and (d) removing excess material not annealed by the laser beam.

2. A process of claim 1, further comprising drying the deposited material to remove said solvent.

3. A process according to claim 1, wherein said substrate is a semiconductor.

4. A process according to claim 1, wherein said material is a metal, metal alloy, dielectric substance or superconductive material.

5. A process according to claim 1, wherein said material is Au, Cu, Pt, Ag, W, Ta, Mo, SiC, $Ni_2GeAs$, $AuGa_2$, $Si_3N_4$, $SiO_2$ or $YBa_2Ca_3O_7$.

6. A process according to claim 1, wherein said solvent is water, a lower alcohol, ethylene glycol, acetone, hexane, benzene, toluene or methylene chloride.

7. A process according to claim 1, wherein said suspension is dispensed in a continuous mode during ink jet printing.

8. A process according to claim 1, wherein said suspension is dispensed in a pulsed mode during said ink jet printing.

9. A process according to claim 1, wherein said colloidal particles have a particle size of about 100 Å to 40 um.

10. A process according to claim 1, wherein said colloidal particles have a particle size of 100-1000 Å.

11. A process according to claim 1, wherein the resultant pattern contains lines having a width of about 1 micron to 1 millimeter.

12. A process according to claim 1, wherein the resultant pattern contains lines having a width of about 1-10 microns.

13. A process according to claim 2, wherein during the drying step the temperature of the substrate is kept below 150° C.

14. A process according to claim 2, wherein the drying step and the annealing step are performed simultaneously.

15. A process for applying multiple levels of patterns of deposited materials to a substrate, consisting of:

(a) loading a substrate wafer into a substrate holder;

(b) pre-etching said substrate by application of an etchant by ink jet printing;

(c) depositing a suspension of colloidal particles of a material in a solvent onto said substrate by ink jet printing;

(d) evaporating the solvent, the material remaining on the substrate;

(e) laser annealing the deposited material to said substrate, the pattern being defined by the path of the laser beam;

(f) washing said substrate to remove residual excess material not annealed by the laser beam; and (g) applying additional levels of materials by repeating steps (b)-(f).

16. A process according to claim 14, wherein at least one of the pattern or the material for each additional level is different from the pattern or material of an adjacent level.

17. A process according to claim 16 wherein said material is Au, Cu, Pt, Ag, W, Ta, Mo, SiC, $Ni_2GeAs$, $AuGa_2$, $Si_3N_4$, $SiO_2$, or $YBa_2Ca_3O_7$.

* * * * *